(12) United States Patent
Frankowsky

(10) Patent No.: US 6,677,770 B2
(45) Date of Patent: Jan. 13, 2004

(54) PROGRAMMABLE TEST SOCKET

(75) Inventor: Gerd Frankowsky, Taufkirchen (DE)

(73) Assignee: Infineon Technologies (DE)

( * ) Notice: Subject to any disclaimer, the term of this patent is extended or adjusted under 35 U.S.C. 154(b) by 179 days.

(21) Appl. No.: 09/906,886

(22) Filed: Jul. 17, 2001

(65) Prior Publication Data

US 2003/0016038 A1 Jan. 23, 2003

(51) Int. Cl.$^7$ .............................................. G01R 31/102
(52) U.S. Cl. ..................... 324/755; 324/537; 324/158.1
(58) Field of Search ................. 324/755, 761, 324/754, 537, 158.1, 765; 439/266, 267, 268, 66, 65, 67, 68, 69, 70, 71, 72

(56) References Cited

U.S. PATENT DOCUMENTS

| | | | | |
|---|---|---|---|---|
| 5,791,914 A | * | 8/1998 | Loranger et al. | 439/71 |
| 5,990,692 A | * | 11/1999 | Jeong et al. | 324/755 |
| 6,152,744 A | | 11/2000 | Maeda | |
| 6,181,149 B1 | | 1/2001 | Godfrey et al. | |

FOREIGN PATENT DOCUMENTS

JP 2001-249163 * 9/2001 .......... G01R/31/26

* cited by examiner

*Primary Examiner*—Kamand Cuneo
*Assistant Examiner*—Paresh Patel
(74) *Attorney, Agent, or Firm*—Lerner, David, Littenberg, Krumholz & Mentlik, LLP

(57) ABSTRACT

A test socket for a semiconductor device includes a guide plate operable to receive the semiconductor device and to maintain electrical terminals of the semiconductor device in registration with electrical terminals of a base, a shell operable to couple to the base and to maintain the guide plate in registration with the electrical terminals of the base, the shell including an aperture in communication with the base through which the guide plate can be inserted and removed when the shell is coupled to the base; and at least one fastener coupled to the shell and operable to maintain the semiconductor device in engagement with the guide plate and to urge the electrical terminals of the semiconductor device in contact with the electrical terminals of the base. A method for operating the test socket is also disclosed.

20 Claims, 3 Drawing Sheets

PROGRAMMABLE TEST SOCKET

BACKGROUND OF THE INVENTION

The present invention relates to test sockets for semiconductor devices, such as ball grid array semiconductor packages, chip scale semiconductor packages, integrated circuit devices, etc. More particularly, the present invention relates to a test socket including an interchangeable guide plate that may be removed without substantial maintenance actions.

With reference to FIG. 1, a side view of a conventional test socket 10 is shown. The test socket 10 is used to receive successive semiconductor devices 12 in order to perform various quality assurance tests, such as electrical performance tests. The semiconductor devices 12 typically include a plurality of electrical terminals 14 that are electrically connected to operative circuitry of the device. In end use, the electrical terminals 14 of the semiconductor devices 12 are soldered to corresponding terminals (or pads) of a printed circuit board in order to access the functionality of the operative circuitry. The soldering process, however, permanently deforms the electrical terminals 14 of the semiconductor devices 12 and, therefore, is an unsuitable process for use during quality assurance testing. Further, the soldering process is not suitable when bare semiconductor chips (or dice) are subject to quality assurance tests.

The test socket 10 is capable of releasably receiving the semiconductor devices 12 and biasing the electrical terminals 14 thereof against corresponding terminals of a printed circuit board 20 without significant permanent deformation of the electrical terminals 14. Thus, quality assurance tests may be performed on a given semiconductor device 12 while in the test socket 10 and the semiconductor device 12 may be subsequently removed without suffering significant deformation.

With further reference to FIG. 2, which shows the test socket 10 decoupled from the printed circuit board 20, the test socket 10 includes a guide plate 16 that engages the semiconductor device 12 and maintains the electrical terminals 14 of the semiconductor device 12 in registration with the corresponding electrical terminals of the printed circuit board 20. In particular, the guide plate 16 includes a support structure 18 that engages a periphery of the semiconductor device 12 in order to maintain the semiconductor 12 in registration with the electrical terminals of the printed circuit board 20. The dimensions of the support structure 18 are matched with the dimensions of the semiconductor device 12. Therefore, when different sizes of semiconductor devices 12 are to be tested (as is common when non-standardized chip scale semiconductor packages are tested), the guide plate 16 must be changed. As best seen in FIG. 2, this entails decoupling the test socket 10 from the printed circuit board 20. Indeed, the guide plate 16 is maintained in registration with the electrical terminals of the printed circuit board 20 by way of a peripheral flange 22 of the guide plate 16 and a corresponding undercut 24 of the test socket 10. When the test socket 10 is coupled to the printed circuit board 20 (usually by way of machine screws, not shown) the undercut 24 biases the peripheral flange 22 of the guide plate 16 against the printed circuit board 20.

The electrical terminals 14 of the semiconductor device 12 are biased against the corresponding electrical terminals of the printed circuit board 20 by way of latches 15 (or levers) that may releasably engage the semiconductor device 12.

Unfortunately, the removal of the test socket 10 from the printed circuit board 20 involves a significant effort, as a technician must remove several machine screws, lift the test socket 10, exchange the guide plate 16, and then reassemble the components. This problem is exacerbated when the quality assurance process involves the use of hundreds of such test sockets 10 and a change in the dimensions of the semiconductor device 12 requires maintenance actions on hundreds of assemblies. These maintenance actions result in a loss of time and coinciding increase in costs associated with the quality assurance testing process.

Accordingly, there is a need in the art for a new test socket that is capable of receiving different sized semiconductor devices without requiring removal from an associated PC board or other substantial maintenance actions.

SUMMARY OF THE INVENTION

A test socket for a semiconductor device, includes: a guide plate operable to receive the semiconductor device and to maintain electrical terminals of the semiconductor device in registration with electrical terminals of a base; a shell operable to couple to the base and to maintain the guide plate in registration with the electrical terminals of the base, the shell including an aperture in communication with the base through which the guide plate can be inserted and removed when the shell is coupled to the base; and at least one fastener coupled to the shell and operable to maintain the semiconductor device in engagement with the guide plate and to urge the electrical terminals of the semiconductor device in contact with the electrical terminals of the base. Preferably, the base is a printed circuit board.

The guide plate may include a periphery, and the aperture may be transversely directed through the shell with respect to the base and include one or more inside surfaces that operatively engage the periphery of the guide plate to prevent substantial lateral movement of the guide plate with respect to the base but permit sliding egress of the guide plate away from the base and through the aperture.

Preferably, the at least one fastener is movable between at least first and second positions, the first position causing the at least one fastener to maintain the semiconductor device in engagement with the guide plate and to urge the electrical terminals of the semiconductor device in contact with the electrical terminals of the base, and the second position permitting removal of the semiconductor device from the test socket and egress of the guide plate from the aperture of the shell.

The test socket preferably further includes at least one stop member coupled to the guide plate and operable to engage the at least one fastener, when in the first position, such that the guide plate is maintained in the aperture of the shell. The at least one stop member may be formed from a compressible material such that the guide plate is resiliently urged toward the base when the at least one fastener is moved into the first position.

Preferably, the at least one fastener includes one or more levers, each including a proximal end hingedly coupled to the shell and a distal end such that the lever is rotatable between at least first and second positions, the first position causing the distal end of the lever to maintain the semiconductor device in engagement with the guide plate and to urge the electrical terminals of the semiconductor device in contact with the electrical terminals of the base, and the second position permitting removal of the semiconductor device from the test socket and egress of the guide plate from the aperture of the shell. The respective distal ends of the one or more levers may be operable to engage the semiconductor device and the at least one stop member of the guide plate when the one or more levers are in the first position. The respective one or more levers may be operable to engage the at least one stop member of the guide plate at an intermediate position between the proximal and distal ends thereof.

In accordance with one or more further aspects of the present invention, a method for using a test socket for a semiconductor device is disclosed. The test socket may comprise a shell coupled to a base, the shell having an aperture and being operable to maintain a guide plate in registration with electrical terminals of the base, the method comprising: inserting a guide plate into the aperture of the shell without decoupling the shell from the base, the guide plate being operable to maintain electrical terminals of the semiconductor device in registration with the electrical terminals of the base; inserting the semiconductor device into the guide plate; and actuating at least one fastener such that the semiconductor device is maintained in engagement with the guide plate and the electrical terminals of the semiconductor device are urged in contact with the electrical terminals of the base.

Preferably, the method further includes: deactivating the at least one fastener such that the semiconductor device may be removed from the guide plate; and extracting the guide plate from the aperture of the shell without decoupling the shell from the base.

Other aspects, features, and advantages of the invention will be apparent from the disclosure herein taken in conjunction with the accompanying drawings.

BRIEF DESCRIPTION OF THE DRAWINGS

For the purposes of illustrating the invention, there are shown in the drawings, forms that are presently preferred, it being understood, however, that the invention is not limited to the precise arrangements and instrumentalities shown.

DETAILED DESCRIPTION

Figure 1:
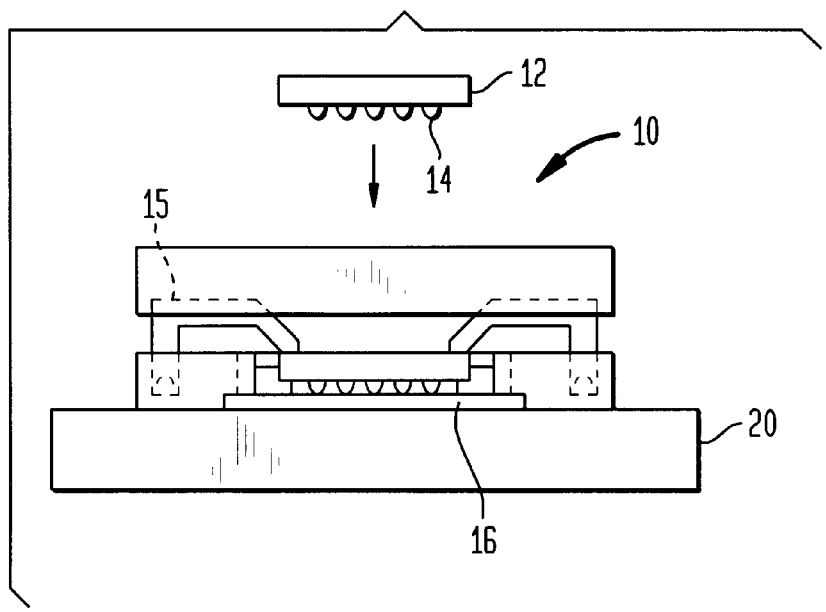
FIG. 1 is a side view of an assembly employing a test socket in accordance with the prior art.
Figure 2:
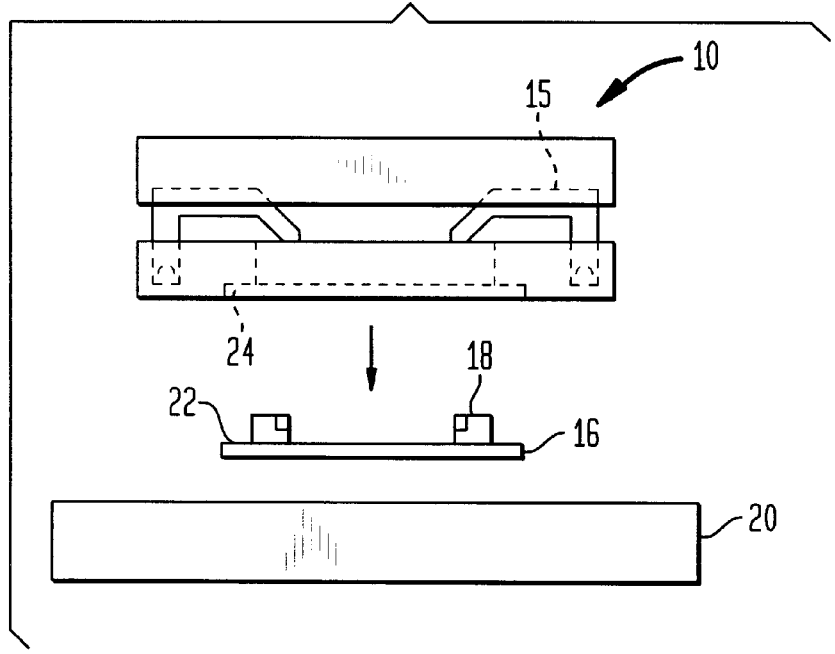
FIG. 2 is an exploded view of the assembly of FIG. 1.
Figure 3:
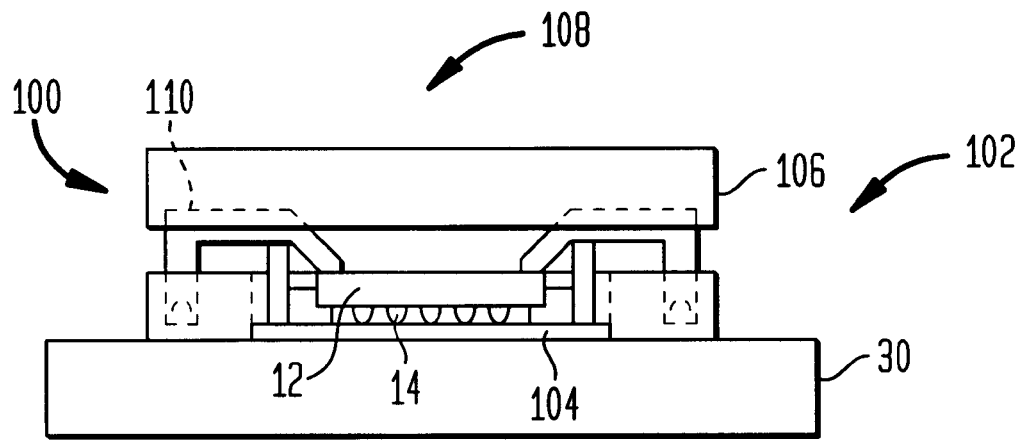
FIG. 3 is a side view an assembly employing a test socket in accordance with one or more aspects of the present invention.

Referring to FIG. 3 of the drawings, wherein like numerals indicate like elements, there is shown an assembly 100 including a test socket 102 in accordance with one or more aspects of the present invention. The test socket 100 is operatively coupled to a base 30, such as a printed circuit board. The test socket 102 includes a guide plate 104 and a shell 106. The shell 106 is preferably operable to couple to the base 30, for example, by way of screws or any other suitable fastening device (not shown).

The shell 106 is operable to maintain the guide plate 104 in registration with electrical terminals of the base 30. The shell 106 preferably includes an aperture 108 in communication with the base 30 (when the test socket 102 is coupled thereto) and operable to provide slidable entry and egress for the guide plate 104 when the shell 106 is coupled to the base 30. The guide plate 104 is preferably operable to receive a semiconductor device 12 and to maintain electrical terminals 14 of the semiconductor device 12 in registration with the electrical terminals (or pads) of the base 30.

Figure 4:
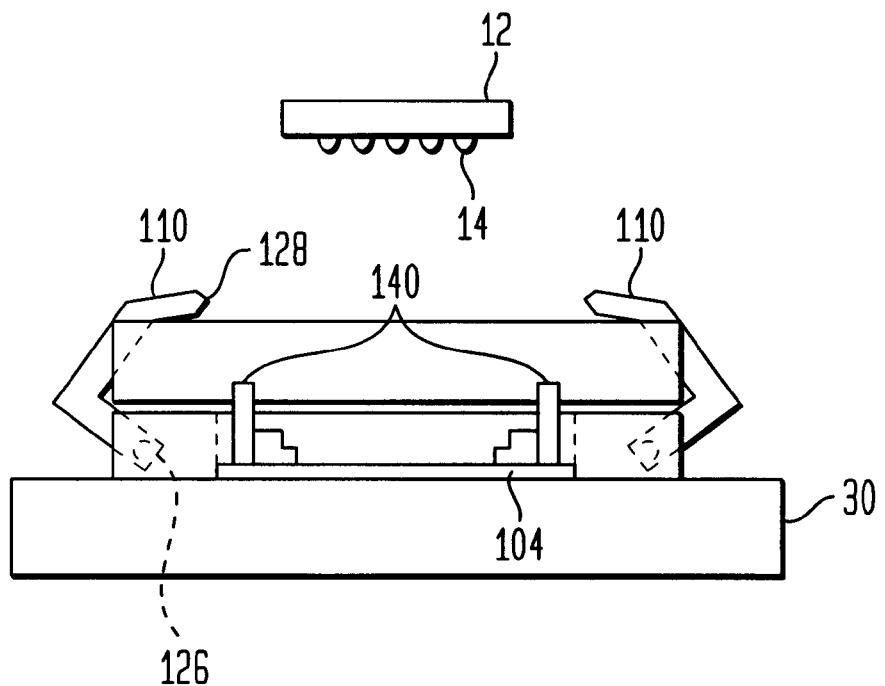
FIG. 4 is a view of the assembly of FIG. 3 showing one or more aspects of the present test socket in operation.

As best seen in FIG. 4, at least one, and preferably two or more, fasteners 110 are coupled to the shell 106 and are operable to maintain the semiconductor device 12 in engagement with the guide plate 104 and to urge the electrical terminals 14 of the semiconductor device 12 into contact with the electrical terminals of the base 30. It is understood that any number of fasteners 110 may be employed without departing from the scope of the invention.

Preferably, the fasteners 110 are moveable between at least first and second positions, FIG. 3 showing the fasteners 110 in the first position and FIG. 4 showing the fasteners 110 in the second position. When in the first position, the fasteners 110 maintain the semiconductor device 12 in engagement with the guide plate 104 and urge the electrical terminals 14 thereof in contact with the electrical terminals of the base 30. When in the second position, however, the fasteners 110 permit removal of the semiconductor device 12 from the test socket 102.

Figure 5:
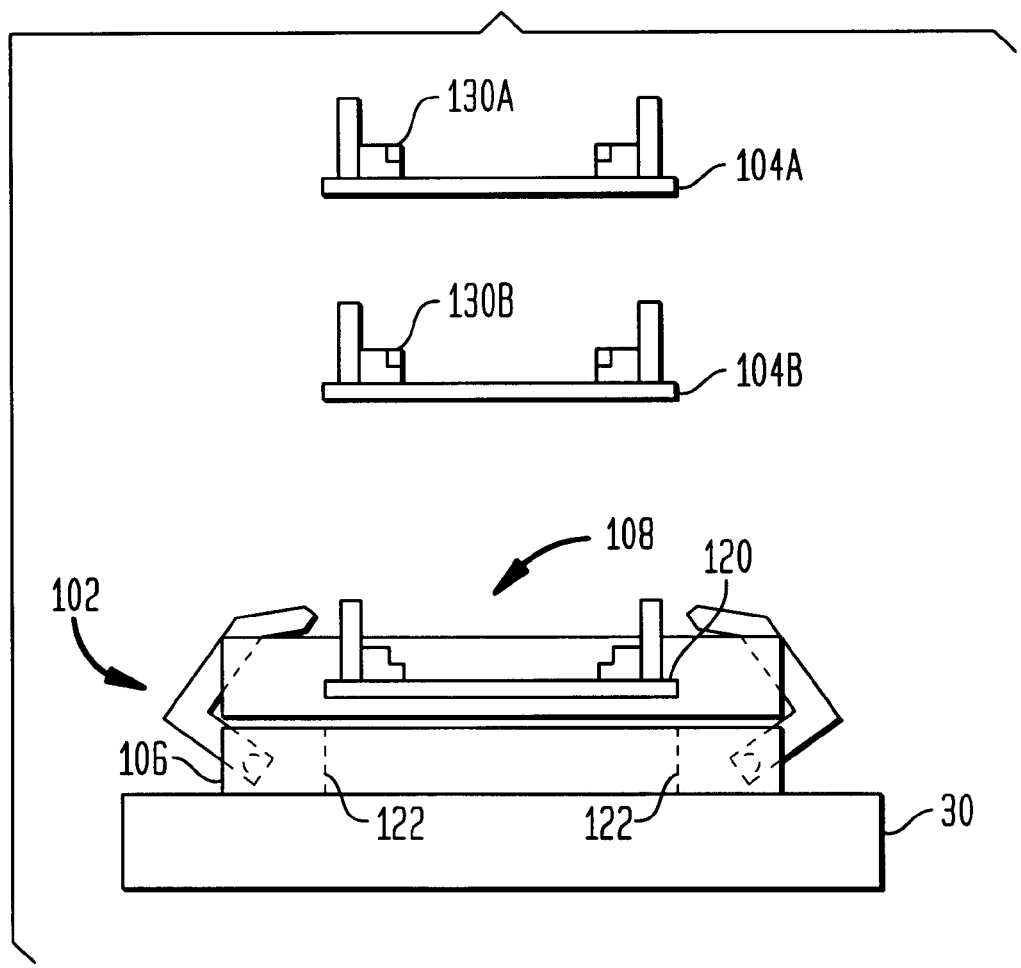
FIG. 5 is a side view of the assembly of FIG. 3 in which one or more further aspects of the invention are illustrated.

As best seen in FIG. 5, the shell 106 preferably permits egress of the guide plate 104 through the aperture 108 when the fasteners 110 are in the second position. More particularly, the aperture 108 of the shell 106 is preferably transversely directed through the shell 106 with respect to the base 30. The aperture 108 is preferably defined by one or more inside surfaces 122 of the shell 106 that operatively engage a periphery 120 of the guide plate 104 to prevent substantial lateral movement of the guide plate 104 with respect to the base 30. However, the aperture 108 permits the guide plate 104 to be inserted and removed (e.g., via slidable entry and egress) transversely (e.g., vertically with respect to FIG. 5) with respect to the surface of the base 30 when not secured by the fasteners 110, while the shell 106 is fastened to the base 30. This advantageously permits a greatly simplified, fast, and cost effective process for substituting any number of guide plates 104A, 104B, etc., each having the same or differing support structures 130A, 130B, etc.

Turning again to FIGS. 3 and 4, the guide plate 104 preferably includes at least one stop member 140 that abuts the fasteners 110 when they are in the first position such that the guide plate 104 is maintained in the aperture 108 of the shell 106. It is most preferred that the guide plate 104 include a number of stop members 140 consistent with the number of fasteners 110 employed. Although it is not necessary, the stop members 140 are preferably formed from a compressible material, such as suitable polymers, short-chain polymers, and elastomers. In any case, the stop members 140 preferably exhibit some elasticity such that the guide plate 104 is resiliently urged toward the base 30 when the fasteners 110 are moved into the first position.

In alternate embodiments, the stop members 140 may be rigid. The fasteners 110 can also be resilient or rigid. In the embodiment where the stop members 140 are rigid, it is preferable but not required, for the removable fasteners 110 to be resilient so as to achieve minimal mechanical stress on the components as discussed above.

The fasteners 110 preferably include a lever structure having a proximal end 126 hingedly coupled to the shell 106 and a distal end 128 operable to engage the periphery of the semiconductor device 12. It is most preferred that the fasteners 110 are spring-biased towards the first position such that the distal ends 128 of the fasteners 110 urge the semiconductor device 12 towards the base 30. The stop members 140 are preferably sized and shaped to engage the fasteners 110 when the fasteners 110 are in the first position, it being most preferred that the stop members 140 engage the fasteners 110 at a position intermediate between the proximal and distal ends 126, 128, respectively, thereof.

Referring again to FIG. 5, and in accordance with at least one or more further aspects of the invention, an advantageous method for using the test socket 102 includes: (i) coupling the shell 106 to the base 30; (ii) inserting the guide plate 104 into the aperture 108 of the shell 106 without decoupling the shell 106 from the base 30; (iii) inserting the semiconductor device 12 into the guide plate 104 (via the aperture 108); and (iv) actuating the fasteners 110 such that the semiconductor device 12 is maintained in engagement with the guide plate 104 and the electrical terminals 14 of the semiconductor device 12 are urged into contact with the electrical terminals of the base 30. Preferably, the method further includes: (v) deactivating the fasteners 110 (e.g., permitting them to move into the second position) such that the semiconductor device 12 may be removed from the guide plate 104; and (vi) extracting the guide plate 104 from the aperture 108 of the shell 106 without decoupling the shell 106 from the base 30.

Advantageously, the present invention permits the interchange of guide plates 104 of the test socket 102 without requiring the maintenance action of decoupling the shell 106 from the base 30. This permits many different sized semiconductor devices 12 to be tested without significant effort in changing the guide plates 104.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A test socket for a semiconductor device, comprising:
   a guide plate operable to receive the semiconductor device and to maintain electrical terminals of the semiconductor device in registration with electrical terminals of a base;
   a shell operable to couple to the base and to maintain the guide plate in registration with the electrical terminals of the base, the shell including an aperture in communication with the base through which the guide plate can be inserted and removed when the shell is coupled to the base; and
   at least one fastener coupled to the shell and operable to maintain the semiconductor device in engagement with the guide plate and to urge the electrical terminals of the semiconductor device in contact with the electrical terminals of the base.

2. The test socket of claim 1, wherein the guide plate includes a periphery, and the aperture is transversely directed through the shell with respect to the base and includes one or more inside surfaces that operatively engage the periphery of the guide plate to prevent substantial lateral movement of the guide plate with respect to the base but permit sliding egress of the guide plate away from the base and through the aperture.

3. The test socket of claim 2, wherein the at least one fastener is movable between at least first and second positions, the first position causing the at least one fastener to maintain the semiconductor device in engagement with the guide plate and to urge the electrical terminals of the semiconductor device in contact with the electrical terminals of the base, and the second position permitting removal of the semiconductor device from the test socket and egress of the guide plate from the aperture of the shell.

4. The test socket of claim 3, further comprising at least one stop member coupled to the guide plate and operable to engage the at least one fastener, when in the first position, such that the guide plate is maintained in the aperture of the shell.

5. The test socket of claim 4, wherein the at least one stop member is formed from a compressible material such that the guide plate is resiliently urged toward the base when the at least one fastener is moved into the first position.

6. The test socket of claim 1, further comprising at least one stop member coupled to the guide plate and operable to engage the at least one fastener, when in the first position, such that the guide plate is maintained in the aperture of the shell.

7. The test socket of claim 6, wherein the at least one fastener includes one or more levers, each including a proximal end hingedly coupled to the shell and a distal end such that the lever is rotatable between at least first and second positions, the first position causing the distal end of the lever to maintain the semiconductor device in engagement with the guide plate and to urge the electrical terminals of the semiconductor device in contact with the electrical terminals of the base, and the second position permitting removal of the semiconductor device from the test socket and egress of the guide plate from the aperture of the shell.

8. The test socket of claim 7, wherein the respective distal ends of the one or more levers are operable to engage the semiconductor device and the at least one stop member of the guide plate when the one or more levers are in the first position.

9. The test socket of claim 8, wherein the respective one or more levers are operable to engage the at least one stop member of the guide plate at an intermediate position between the proximal and distal ends thereof.

10. The test socket of claim 1, wherein the base is a printed circuit board.

11. A method for using a test socket for a semiconductor device, said test socket comprising a shell coupled to a base, the shell having an aperture and being operable to maintain a guide plate in registration with electrical terminals of the base, said method comprising:
    inserting a guide plate into the aperture of the shell without decoupling the shell from the base, the guide plate being operable to maintain electrical terminals of the semiconductor device in registration with the electrical terminals of the base;
    inserting the semiconductor device into the guide plate; and
    actuating at least one fastener such that the semiconductor device is maintained in engagement with the guide plate and the electrical terminals of the semiconductor device are urged in contact with the electrical terminals of the base.

12. The method of claim 11, further comprising:
    deactivating the at least one fastener such that the semiconductor device may be removed from the guide plate; and
    extracting the guide plate from the aperture of the shell without decoupling the shell from the base.

13. The method of claim 11, wherein the guide plate includes a periphery, and the aperture is transversely directed through the shell with respect to the base and includes one or more inside surfaces that operatively engage the periphery of the guide plate to prevent substantial lateral movement of the guide plate with respect to the base but permit sliding egress of the guide plate away from the base and through the aperture.

14. The method of claim 13, wherein the at least one fastener is movable between at least first and second positions, the first position causing the at least one fastener to maintain the semiconductor device in engagement with the guide plate and to urge the electrical terminals of the semiconductor device in contact with the electrical terminals of the base, and the second position permitting removal of the semiconductor device from the method and egress of the guide plate from the aperture of the shell.

15. The method of claim 14, further comprising at least one stop member coupled to the guide plate and operable to engage the at least one fastener, when in the first position, such that the guide plate is maintained in the aperture of the shell.

16. The method of claim 15, wherein the at least one stop member is formed from a compressible material such that the guide plate is resiliently urged toward the base when the at least one fastener is moved into the first position.

17. The method of claim 11, wherein the at least one fastener includes one or more levers, each including a proximal end hingedly coupled to the shell and a distal end such that the lever is rotatable between at least first and second positions, the first position causing the distal end of the lever to maintain the semiconductor device in engagement with the guide plate and to urge the electrical terminals of the semiconductor device in contact with the electrical terminals of the base, and the second position permitting removal of the semiconductor device from the method and egress of the guide plate from the aperture of the shell.

18. The method of claim 17, wherein the respective distal ends of the one or more levers are operable to engage the semiconductor device and the at least one stop member of the guide plate when the one or more levers are in the first position.

19. The method of claim 18, wherein the respective one or more levers are operable to engage the at least one stop member of the guide plate at an intermediate position between the proximal and distal ends thereof.

20. The method of claim 11, wherein the base is a printed circuit board.

* * * * *

UNITED STATES PATENT AND TRADEMARK OFFICE
CERTIFICATE OF CORRECTION

PATENT NO. : 6,677,770 B2
DATED : January 13, 2004
INVENTOR(S) : Gerd H. Frankowsky It is certified that error appears in the above-identified patent and that said Letters Patent is hereby corrected as shown below:

<u>Title page,</u>
Item [75], Inventor, please delete "Taufkirchen" and insert
-- Hohenkirchen-Siegertsbrunn --.

Signed and Sealed this

Eleventh Day of May, 2004

JON W. DUDAS
*Acting Director of the United States Patent and Trademark Office*